United States Patent [19]
Waters

[11] Patent Number: 5,550,877
[45] Date of Patent: *Aug. 27, 1996

[54] METHOD AND APPARATUS FOR ATTENUATING JITTER IN A DIGITAL TRANSMISSION LINE

[75] Inventor: Michael R. Waters, Pleasanton, Calif.

[73] Assignee: VLSI Technology, Inc., San Jose, Calif.

[*] Notice: The term of this patent shall not extend beyond the expiration date of Pat. No. 5,479,457.

[21] Appl. No.: 477,197

[22] Filed: Jun. 7, 1995

Related U.S. Application Data

[63] Continuation of Ser. No. 113,574, Aug. 27, 1993, Pat. No. 5,479,457.

[51] Int. Cl.⁶ .................. H04L 7/00; H04L 25/36; H04L 25/40
[52] U.S. Cl. .................. 375/372; 375/373; 375/375; 331/34; 331/DIG. 3
[58] Field of Search .................. 375/371, 372, 375/373, 375, 376; 331/34, 1 R, 25, 1 A, DIG. 3

[56] References Cited

U.S. PATENT DOCUMENTS

| | | | |
|---|---|---|---|
| 4,241,308 | 12/1980 | Cellier et al. | 328/55 |
| 4,577,163 | 3/1986 | Culp | 331/1 A |
| 4,627,080 | 12/1986 | Debus, Jr. | 375/110 |
| 4,712,225 | 12/1987 | Nelson | 377/43 |
| 4,791,378 | 12/1988 | Waltham | 328/155 |
| 4,933,890 | 6/1990 | Nuytkens et al. | 364/721 |
| 5,012,437 | 4/1991 | Recker et al. | 364/701 |
| 5,036,294 | 7/1991 | McCaslin | 331/1 A |
| 5,268,935 | 12/1993 | Mediaville et al. | 375/371 |
| 5,268,936 | 12/1993 | Bernardy | 375/371 |
| 5,280,295 | 1/1994 | Kelley et al. | 342/463 |
| 5,291,526 | 3/1994 | Ichikawa et al. | 375/371 |
| 5,365,182 | 11/1994 | King | 327/115 |

FOREIGN PATENT DOCUMENTS

3600795A1  7/1987  Germany .................. 25/38

OTHER PUBLICATIONS

Lipman, Jim "Newest T1/E1 Chip From VLSI Focus on High–Speed Digital Transmission Systems," VLSI Inquiries, Jan. 25, 1993.

Lipman, Jim "T1/E1 FSB™ Cells From VLSI Technology Simplify ASIC–Based Communication System Design," VLSI Inquiries, Mar. 8, 1993.

"Jitter Attenuator FSB™ Functional System Block," VLSI Technology, Inc., Jan. 1993, pp. 1–3.

Walter, Stephen M. et al., "Digital Phase–Locked Loop with Jitter Bounded," IEEE Transactions on Circuits and Systems, Jul. 1989, vol. 36, No. 7, pp. 981–987.

*Primary Examiner*—Stephen Chin
*Assistant Examiner*—Don Vo
*Attorney, Agent, or Firm*—Hickman Beyer & Weaver, LLP

[57] ABSTRACT

A method and apparatus for attenuating jitter in digital signals. A recovered clock is derived from the digital signal and the digital signal is stored in a buffer. The derived clock is input to an input counter which counts a predetermined number of degrees out of phase with an output counter. When the input counter is at a maximum counter value, the output counter value is latched to the address inputs of a ROM look-up table, which outputs a coefficient to a numerically controlled oscillator (NCO). The NCO includes a low frequency portion that adds the coefficient successively to itself and outputs a carry out (CO) signal. A high frequency portion of the NCO receives a high frequency clock and preferably divides down the high frequency clock to a clock frequency which is centered at the desired output frequency. The high frequency portion preferably includes an edge detect circuit that receives the CO signal and adjusts the frequency of the output clock to produce a compensation clock. The compensation clock clocks the output counter which causes a buffer to output a digital signal that is substantially free of jitter.

16 Claims, 4 Drawing Sheets

66 ↘

| ADDRESS | COEFFICIENT |
|---------|-------------|
| 0-1 | 1811 |
| 2-3 | 1830 |
| 4-5 | 183F |
| 6-7 | 184E |
| 8-9 | 185D |
| 10-11 | 186C |
| 12-13 | 187B |
| 14-15 | 188A |
| 16-17 | 1899 |
| 18-19 | 18A8 |
| 20-21 | 18B7 |
| 22-23 | 18C6 |
| 24-25 | 18D5 |
| 26-27 | 18E4 |
| 28-29 | 18F3 |
| 30-31 | 18FF |

66' ↘

| ADDRESS | COEFFICIENT |
|---------|-------------|
| 0-7 | 1822 |
| 8 | 182F |
| 9 | 183C |
| 10 | 1849 |
| 11 | 1856 |
| 12 | 1863 |
| 13 | 1870 |
| 14 | 187D |
| 15 | 188A |
| 16 | 1897 |
| 17 | 18A4 |
| 18 | 18B1 |
| 19 | 18BE |
| 20 | 18CB |
| 21 | 18D8 |
| 22 | 18E5 |
| 23 | 18F2 |
| 24-31 | 18F1 |

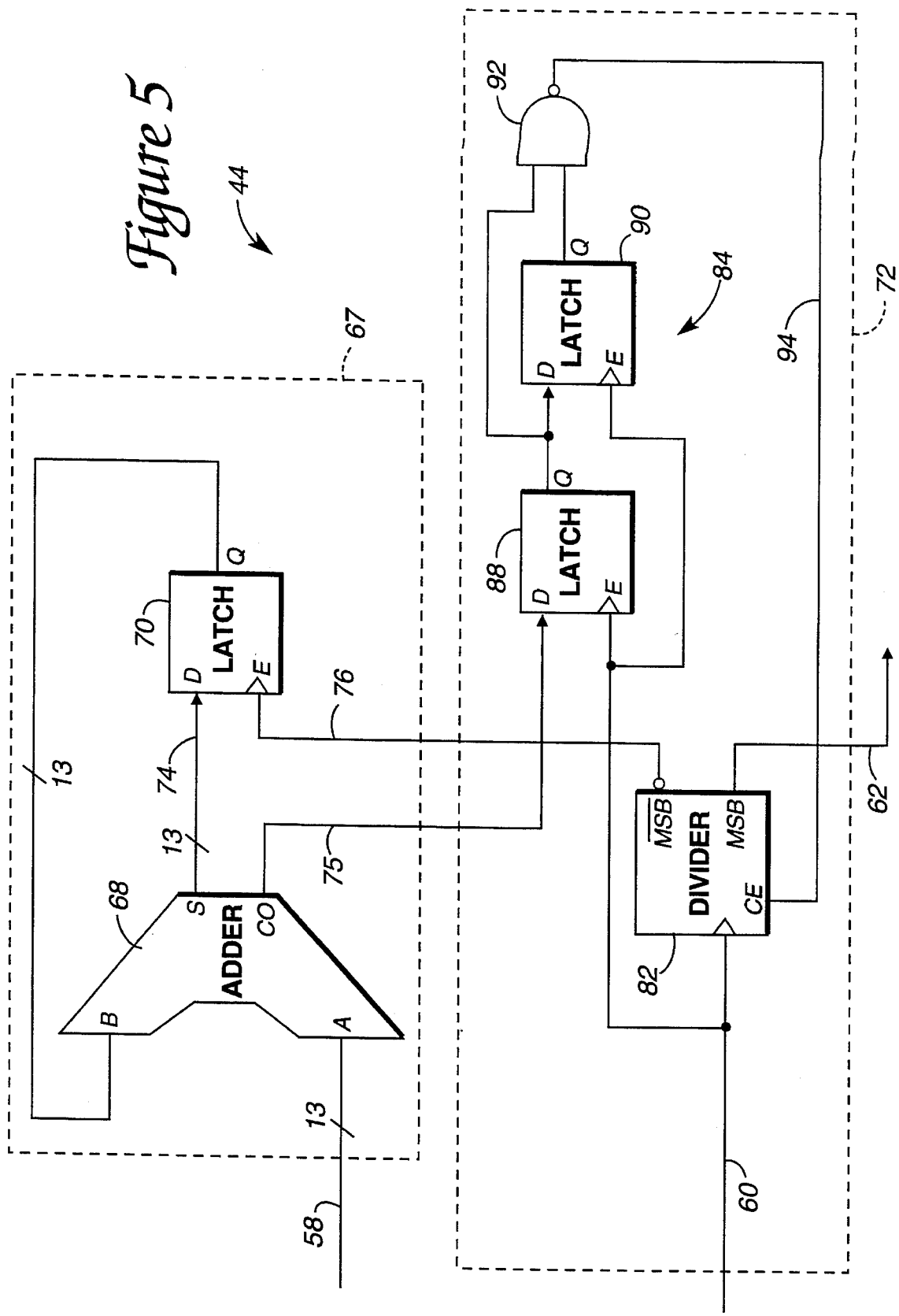

METHOD AND APPARATUS FOR ATTENUATING JITTER IN A DIGITAL TRANSMISSION LINE

This is a continuation of application Ser. No. 08/113,574 filed on Aug. 27, 1993 now patented U.S. Pat. No. 5,479,457.

BACKGROUND OF THE INVENTION

1. Field of the Invention

This invention relates to the communication of signals, and more particularly to the transmission and reception of digital signals.

2. Background of the Related Art

Communication systems are used to transmit and receive signals over a communication channel. One common form of communication system is a telephone system for transmitting and receiving voice and data signals. FIG. 1 is a pictorial representation of a telephone communication system 10. Central office 11 sends telephone signals over wires 12 to central office 14. Similarly, central office 14 can send signals to central office 11 over wires 12. Wires 12 are supported by poles 16.

The telephone communication system 10 is preferably a digital communication system; i.e., digital signals representing digital data are sent over wires 12. When carrying digital data, these wires 12 are often referred to as "T1" lines. This digital data can represent voice and other types of analog data, as well as purely digital information. Since the distances between offices 11 and 14 may be relatively large, the digital signal carried by wires 12 may pick up "glitches" or "noise". To reduce this noise, several repeater apparatus 18 are preferably placed on intermediate poles 16 or at the receiving offices 11 and 14. A repeater apparatus 18 detects and then retransmits the digital signal so that the original digital values of the signal are not obscured by noise. Using several repeater apparatus 18, a signal may be transmitted a long distance over wires 12 and arrive at a receiver including virtually all of its original information.

A repeating apparatus 18 and a receiving apparatus 19 are shown in FIG. 2. Receiving apparatus 19 will typically be provided at receiving offices 11 and 14. Clock and data recovery apparatus 20 receives a signal from T1 line 12 and derives a clock signal therefrom. This can be accomplished, for example, by oversampling, as is well known to those skilled in the art. The data signal output of apparatus 20 retains the information contained in the original signal on T1 line 12. A jitter attenuator 22 is coupled to the clock and data outputs of the apparatus 20 to remove digital "jitter".

Jitter is defined as intermittent phase shifts of a digital signal. An example of jitter is shown in FIG. 3. Waveform 23 is an example of an ideal, original waveform transmitted from a source. Waveform 24 is a waveform that includes jitter. Jitter shifts 26 can be caused by repeaters, other equipment, inductive delays, etc. Jitter can accumulate over time and eventually cause the repeated waveform to be an entire pulse width off from the original waveform. Thus, over many repeaters, jitter can cause uncertainty in which time period a pulse occurs. Timing and information errors at the receiving end can result from this effect.

Problems from jitter can also occur in the clock and data recovery apparatus 20 shown in FIG. 2. The phase locked loop typically used in apparatus 20 can oscillate for a short time at a specific frequency without receiving a timing reference from a pulse, but will begin to drift and produce an incorrect clock signal if there is a long interval of zeros in a signal, i.e. no pulse edges. Such an interval of zeros can also cause jitter.

The problem of jitter has been addressed in the prior art by an analog jitter attenuator. Typically, an analog jitter attenuator 22 is connected to the clock and recovery block 20 to receive the clock and data signals. The jitter attenuator produces an output clock at an average of the input clock frequency. Since the output clock is the average of the input clock frequency, short term variations in the input signal are filtered out. These analog jitter attenuators 22 of the prior art have many of the accuracy, stability and noise problems associated with analog devices.

An article, "Digital Phase-Locked Loop with Jitter Bounded", by Stephen M. Walters and Terry Troudet (IEEE Transactions on Circuits and Systems, July 1989), describes a digital jitter attenuator that uses a digital phase-locked loop to generate signals that satisfy pre-imposed requirements on jitter over a given range of frequencies. Control of the jitter is obtained by means of a frequency-phase window comparator which compares a bit overflow/underflow of a digital controlled oscillator to a fixed frequency-phase window.

A problem with this prior art digital jitter attenuator occurs due to the high frequency clock required in the numerically controlled oscillator (NCO) to produce a jitter-free data signal. A high frequency clock is required to achieve an accurate output clock that can be finely adjusted. In the prior art, a large number of bits is required in the NCO to achieve such a high resolution. However, it is difficult to process (i.e., add) a large-bit number in the short period of the high frequency clock. The prior art is thus limited in the frequency resolution of the signal clock it can output and the amount of jitter it can reduce.

What is needed is an apparatus and method that will reduce jitter in transmission systems using an accurate, high resolution digital system.

SUMMARY OF INVENTION

The present invention addresses the problems in the prior art by providing a method and apparatus for the reduction of jitter in digital communication systems. A digital apparatus is provided that uses a numerically controlled oscillator (NCO) that preferably includes a low frequency portion and a high frequency portion to output a compensation clock. The compensation clock controls a buffer to output a digital signal substantially free of jitter.

In the present invention, a jittered signal is input to a jitter sensing mechanism that produces a digital signal in accordance with the amount of jitter on the input signal. A clock generator mechanism, including a low frequency portion and a high frequency portion, receives the digital signal. The high frequency portion outputs a clock of a compensation frequency determined, in part, by the digital signal from the jitter sensing mechanism and sends the compensation clock to a buffer which produces an output signal with reduced jitter.

The jitter sensing mechanism preferably includes a input counter and an output counter that are intentionally out of phase of each other. An input clock is derived from the input signal and and is coupled to the input counter. As the input counter value arrives at a predetermined maximum count, the output counter value is latched to the address bus of a ROM containing a look-up table. If the output counter value is not a predetermined number of degrees out of phase with the input counter value, a timing discrepancy is present on the input clock, possibly caused by jitter. A correction coefficient is read from the look-up table of the ROM to control an NCO.

The NCO of the present invention is preferably divided into two portions. A low frequency portion includes an adder and a latch. The adder receives the coefficient signal from the look-up table of the ROM and continuously adds the coefficient value to itself. Each sum is output to a latch, which sends the sum back to the adder according to a clock provided by the high frequency portion. The carry out (CO) signal from each sum is preferably output from the adder to a high frequency portion of the NCO.

The high frequency portion preferably includes a high frequency clock that is divided to a lower frequency and input to the latch of the low frequency portion. A frequency divider is enabled by the CO from the low frequency portion that has been passed through an edge detect circuit. The edge detect circuit preferably enables and disables the divider to compensate for jitter. A compensation clock signal is output from the divider and is used to provide a jitter-free data output signal using data stored in the buffer.

These and other advantages of the present invention will become apparent to those skilled in the art after reading the following descriptions and studying the various figures of the drawings.

BRIEF DESCRIPTION OF THE DRAWINGS

FIG. 5 is a block diagram of a numerically controlled oscillator of the present invention.

DETAILED DESCRIPTION OF THE PREFERRED EMBODIMENTS

Figure 1:
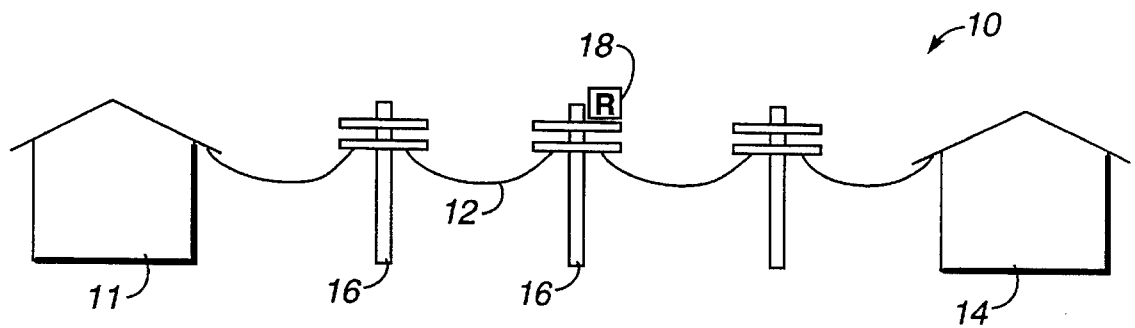
FIG. 1 is a pictorial representation of a communication system used for the present invention.
Figure 2:
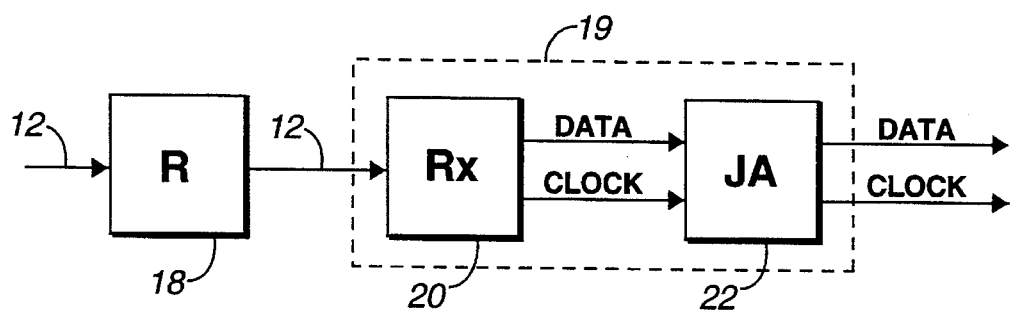
FIG. 2 is a block diagram of a prior art repeater, clock and data recovery apparatus and jitter attenuator.
Figure 3:
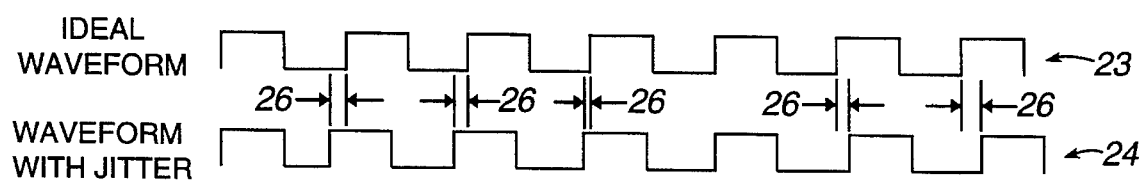
FIG. 3 is a diagram of an original signal and the signal including jitter.
Figure 4:
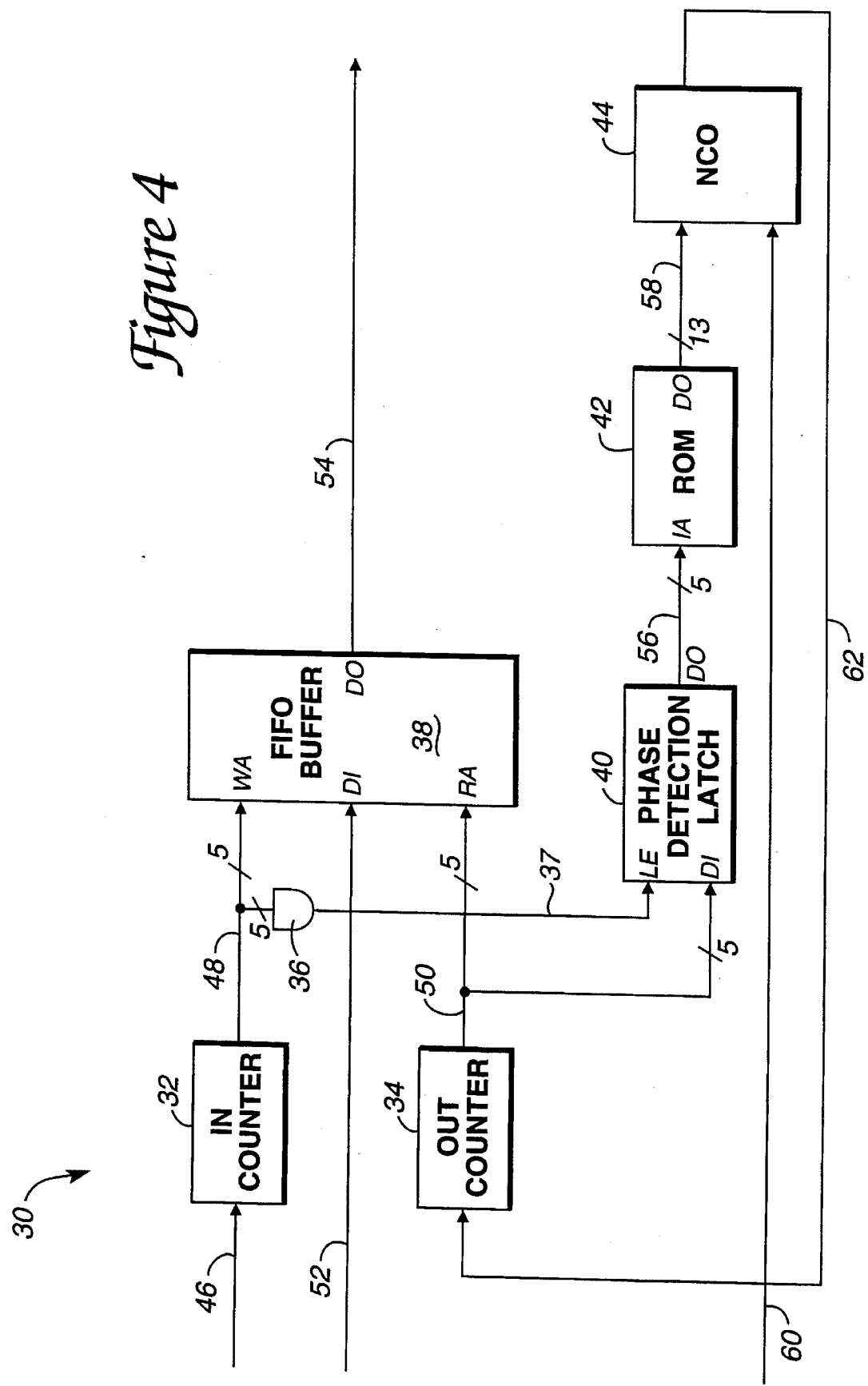
FIG. 4 is a block diagram of the jitter attenuator of the present invention.

FIGS. 1, 2 and 3 were discussed in the Background section of this specification. FIG. 4 is a block diagram of a jitter attenuator 30 in accordance with the present invention which replaces the prior art analog jitter attenuator 22 illustrated in FIG. 2. Jitter attenuator 30 preferably includes an input counter 32, an output counter 34, an AND gate 36, a buffer 38, a phase detect latch 40, a read only memory (ROM) 42, and a numerically controlled oscillator (NCO) 44. Input counter 32 is coupled to an input clock signal line 46 which provides an input clock from a clock and data recovery apparatus 20 (FIG. 2). The input counter 32 counts with each pulse of the input clock. By way of example, a suitable counter is a 5 bit modulo 32 counter. The output of the input counter 32, in this example, is a 5 bit number provided on bus 48.

Output counter 34 can be the same type of counter as input counter 32. The count of output counter 34 is set to a predetermined phase difference from input counter 32. In the preferred embodiment, the count of output counter 34 is set to be 180 degrees out-of-phase with the count of input counter 32, explained in further detail with reference to FIG. 4a. Output counter 34 is coupled to buffer 38 by 5-line bus 50.

Buffer 38 is preferably a RAM-based FIFO ring (i.e. random access memory (RAM) based) buffer, such as a 32 bit dual port RAM. Other kinds of buffers can also be used. Buffer 38 preferably includes a write address input WA which is coupled to input counter 32 by bus 48. A read address RA input of buffer 38 is preferably coupled to output counter 34 by bus 50, and a data input port DI of buffer 38 is preferably coupled to input data line 52 from a clock and data recovery apparatus 20 (FIG. 2). The data output port DO of buffer 38 is coupled to an output line 54 which carries a de-jittered digital output signal for further processing in the central office. Buffer 38 thus functions as an output mechanism for the jitter attenuator 30.

The AND gate 36 is coupled to each line of bus 48. Therefore, in this example, this is a five input AND gate. The output of AND gate 36 is coupled to a latch enable port LE of phase detection latch 40 by a line 37. A suitable phase detection latch 40 includes a 5 flip-flops, each of which store one bit of data. The data input bus DI of latch 40 is coupled to bus 50 of output counter 34. The data output bus DO 56 from latch 40 is coupled to ROM 42.

The input address ports IA of ROM 42 are coupled to the output data bus of latch 40 by bus 56. By way of example, ROM 42 may take the form of a 32×13 ROM. The output data ports DO of ROM 42 are coupled to NCO 44 by bus 58, which, in the described embodiment, takes the form of a 13 bit bus. NCO 44 also is preferably coupled to a high frequency clock line 60. NCO 44 is a clock generator mechanism that outputs a compensated clock on line 62, which is coupled to an input port of output counter 34. NCO 44 is described in detail below with reference to FIG. 5.

In an alternate embodiment, the components of jitter attenuator 30 are made by constructing an application-specific integrated circuit (ASIC). Digital components such as counters, ROM, flip flops, etc. can be designed in an ASIC using logic gates, etc., and is well known to those skilled in the art.

Figures 4A, 4B, 4C:
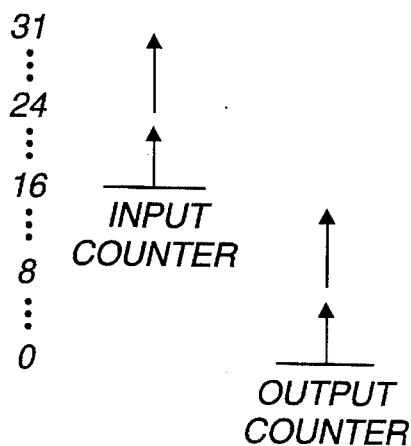
FIG. 4a is an illustration of the input and output counter values used in the present invention.
FIG. 4b is a preferred ROM-based look-up table used in the present invention.
FIG. 4c is a preferred ROM-based look-up table used in an alternate embodiment of the present invention.

The operation of the preferred embodiment of jitter attenuator 30 is briefly described as follows. The input clock on line 46 and input data on line 52 are provided by a prior art clock and data recovery apparatus 20. Input data on line 52 is sent to the DI port of buffer 38. The input clock on line 46 increments the value of input counter 32. In the described embodiment, input counter 32 is initialized at a count of 16, which is half the preferred maximum count of 31, as illustrated in FIG. 4a. Output counter 34 is initialized at a value of 0, which is 180 degrees out-of-phase from the initial value of the input counter, as is also illustrated in FIG. 4a. The input counter 32 value is output on bus 48 and is sent to the RA port of buffer 38. Buffer 38 uses the input counter value as a memory address in the buffer's RAM and stores the input data on line 52 at that address.

The inputs of AND gate 36 are coupled to bus 48. If all N bits (in the preferred embodiment, 5 bits) are high (1's), a terminal or predetermined maximum count of input counter 32 has been reached and a high signal is output from AND gate 36. Preferably, this terminal count is 31 on the 5-bit bus 48. The high signal output of AND gate 36 is coupled to the LE input of phase detection latch 40 by line 37.

Output counter 34 preferably starts counting at a value of 0. Output counter 34 increments its counter value with each clock pulse on clock line 62. The output counter 34 outputs a value on bus 50 which is coupled to the RA port of buffer 38. The output counter value is used to address a memory location in the RAM of the buffer and data stored at that memory location is output on line 54. Data is output from the buffer 38 preferably after the buffer is about half full; this occurs when the input counter 32 has reached a maximum count of 31 in the present example.

The output counter value is also coupled to phase detection latch 40 by a bus 50. Phase detection latch 40 is operative to latch onto the data on bus 50 when line 37 provides a latch enable signal, i.e. when input counter 32 is at a predetermined maximum counter value. When the input counter outputs the maximum value of 31, the output counter should ideally output a value of 15, which is 180 degrees out-of-phase with the input counter value. The latched output counter value is coupled to the Input Address IA port of ROM 42, where a coefficient value stored in a look-up table is addressed.

A preferred look-up table 66 stored in ROM 42 is shown in FIG. 4b. The address shown in the left column is the latched output counter value stored in latch 40. Since the output counter value is 180 degrees out-of-phase with the input counter value in this preferred embodiment, the output counter value should be about 14 or 15. Addresses 14 and 15 have a coefficient value of 188A hex stored at that location in memory; this coefficient is output on bus 58 to NCO 44. NCO 44 uses the coefficient to determine the frequency of the compensation clock on line 62. NCO 44 drives the output compensation clock in a frequency range centered preferably at 1.544 MHz, which is the frequency standard used for T1 transmission lines. Of course, other frequencies can be output from the NCO 44, such as 2.048 MHz for the European standard E1.

If the output counter value is not 14 or 15, then the output and input counters are no longer 180 degrees out-of-phase. This indicates that there is a timing discrepancy between the input counter and the output counter. If a timing discrepancy occurs, a different coefficient is output by ROM 42 to adjust the frequency of the compensation clock developed by NCO 44. The addresses input to ROM 42 are, for convenience, paired. Each pair of addresses is assigned a coefficient in the look-up table of ROM 42. Preferably, each address pair above the 14–15 pair produces a coefficient which decreases the NCO output clock frequency by about 44 Hz, and each address pair below the 14–15 pair produces a coefficient which increases the NCO clock frequency by about 44 Hz. For example, if the latched output counter value on bus 56 is 17, it means that the input counter is counting slightly slower than the output counter. In other words, by the time the input counter counted to 31, the output counter had counted to 17. The output counter value 17 is addressed in ROM 42, and a coefficient of 1899 hex from the look-up table of FIG. 4b is output from the ROM on bus 58 to NCO 44. NCO 44 receives the coefficient, which tells it to slightly decrease the frequency of the compensation clock by about 44 Hz on line 62 which drives output counter 34, i.e. the output counter is slowed to match the slower input counter. Output counter 34 is thus triggered to output a count value at a slightly slower speed to align itself with the input counter value; this slowed output counter value is received at buffer 38 and the data signal at that address is output on line 54 at a compensated clock frequency to produce a jitter-free signal. As mentioned previously, the buffer 38 is ideally half full, with 16 of 32 locations filled. Jittered data input on line 52 may "fill up" some of the extra buffer memory locations faster than the OUT counter outputs the data on line 54; or the OUT counter may output data faster than jittered data is being input. The buffer 38 serves to "absorb" jittered data so that the OUT counter can output jitter-free data from the buffer at the compensated clock rate.

In circuit 30, the input counter 32, output counter 34, AND gate 36, phase detection latch 40, and ROM 42 can collectively be considered a jitter sensing mechanism, since they function to provide a coefficient to NCO 44 that adjusts the compensation clock to compensate for jitter.

Using circuit 30, a jittered input clock is corrected by slowly increasing and decreasing the frequency of a derived clock to compensate for the phase shift of the jitter. The output of the circuit 30 is therefore substantially jitter-free. Since, in the described embodiment, a coefficient is sent to the NCO 44 from ROM 42 only when the input counter reaches a count of 31, the compensation clock signal on line 62 is adjusted every 32nd pulse of the input clock. In practice, this proves to be quite effective in substantially removing jitter from a digital signal.

FIG. 4c shows an alternate embodiment of a look-up table 66' stored in ROM 42. In table 66', many addresses in the ROM are assigned unique coefficients. This arrangement provides greater resolution and thus a more accurate frequency for the compensation clock output from NCO 44 than the "bracketed" table shown in FIG. 4b, where two adjacent addresses are assigned the same coefficient. In addition, if the input signal is temporarily lost, the look-up table of FIG. 4c will allow for a faster convergence than the table of FIG. 4b. Look-up table 66' is nonlinear; i.e., several addresses at each end of the range (0–7 and 24–31) are associated with one coefficient value. This nonlinearity quickly forces the jitter attenuator to the middle range of addresses (8–23) which are optimized for systems with a relatively minor amount of jitter on their input data line. If, however, a large amount of jitter occurs on the input signal so that the output counter varies, for example, within 90 degrees of the input counter (i.e., the output counter value is, for example, 5 or 27 when the input counter value is 31), then the look-up table of FIG. 4c is not as efficient in de-jittering the signal as is the look-up table of FIG. 4b. Thus, in the case of extensive jitter, the linear look-up table 66 of FIG. 4b may produce better results.

FIG. 5 is a block diagram of the NCO 44 of the present invention. The NCO 44 includes a low frequency portion 67 and a high frequency portion 72. The low frequency portion preferably includes an adder 68 and a latch 70. The adder 68 can be, for example, a 13-bit adder at a port A. Adder 68 receives a coefficient from ROM 42 on bus 58, which is a 13-line bus in the described embodiment. Adder 68 is operative to add the inputs at A and B and output the sums on bus 74, which is also a 13-line bus in this embodiment. The adder also outputs the carry out (CO) bit from the adding operation on line 75, which is coupled to the high frequency section 72. The data input port (DI) of latch 70 is coupled to bus 74, and the output Q of latch 70 is fed back to input B of adder 68. The clock input 76 of latch 70 is coupled to high frequency section 72. A suitable latch that can be used for latch 70 include 13 D flip flops.

A high frequency portion 72 in accordance with the present invention includes a high frequency clock on line 60, a divider 82, and an edge detector circuit 84. In this described embodiment, the high frequency clock has a frequency of about 100 MHz. The high frequency clock is input to frequency divider 82, which is preferably a counter that divides the frequency of the clock signal; in the described embodiment, divider 82 is a 6-bit counter that divides the 100 MHz clock frequency by 64, producing a 1.56 MHz clock on the output 62. Of course, other dividing factors can be used, such as a divide by 48 to produce a 2.083 MHz clock (later adjusted for the E1 standard). The most significant bit (MSB) from divider 82 is used for the output (compensation) clock on line 62. The inverse of the MSB value is coupled to the enable input E of latch 70 by line 76.

The high frequency clock on line 60 also is input to edge detector circuit 84. Edge detector circuit includes latch 88, latch 90, and NAND gate 92. The high frequency clock on line 60 is coupled to the enable E inputs of both latches 88 and 90. Latch 88 receives the CO from adder 68 on line 75 at its D input. Latch 90 receives the output Q from latch 88 at its D input. The two inputs of a NAND gate 92 are coupled to the Q outputs of latches 88 and 90. The output of NAND gate 92 is developed on line 94. Line 94 is coupled to the Count Enable of divider 82 and is operative to disable and enable the divider 82.

The circuit illustrated in FIG. 5 operates as follows. A coefficient from the look-up table in ROM 42 is input as a digital signal on bus 58 to the A input of adder 68. The coefficients in the look-up table of ROM 42 are selected to provide a CO from adder 68 after a certain number of summations to generate a specific clock frequency.

A preferred method to calculate coefficients as shown in FIGS. 4b and 4c is described as follows. A coefficient is defined as the frequency of the high frequency clock (on line 60) divided by the output frequency. For example, a high frequency clock at 100 MHz and an output frequency of 1.544 MHz produces a coefficient of 100 MHz/1.544 MHz= 64.76684. The high frequency portion 72 of the NCO divides by 64, so it is the fractional part of the coefficient that is handled by the low frequency portion 67. To convert the fractional part (0.76684) to an NCO coefficient, the fractional part is multiplied by $2^N$, where N is the number of bits in the adder. For example, using a 13 bit adder, the NCO coefficient in the example is $0.76684 \times 2^{13} = 6282 = 188A$ hex. This is the center value in the look up table and corresponds to the output counter being in synchronization with the input counter. To compute the remaining values in the look up table, a frequency tolerance in the communication system and jitter attenuator is used. In a typical digital telephone system, for example, the jitter has a maximum range of about 138 Hz peak-to-peak, or ±69 Hz. The tolerance of the input clock being sent into the jitter attenuator is about ±200 Hz. A tolerance for the crystals of the counters used in the preferred embodiment increases the total tolerance to about ±300 Hz. If the entire range of 600 Hz is divided by the number of entries in the look up table (16 in the described embodiment), a step size of 37.5 Hz results. This step size is added to or subtracted from the output frequency successively to compute the other coefficients. To make the step size an even hexidecimal number, an offset of F (hex) is chosen in the described embodiment (about 44 Hz between coefficients).

Adder 68 adds the coefficient at input A to the value at input B, which is the immediately previous sum that was output from the adder; the new sum is then output on bus 74. The CO from this sum is a "low frequency" signal (relative to the high frequency clock on line 60) output on line 75.

The high frequency clock on line 60 is input to divider 82 and edge detector circuit 84. Divider 82 is preferably a 6-bit counter that counts to 64, incrementing with each high frequency clock pulse. The MSB of the divider output is the output compensation clock signal on line 62. In this described embodiment, the compensation clock on line 62 from divider 82 is thus 100 MHz/64=1.5625 MHz. The edge detector circuit 84 receives the high frequency (100 MHz) clock at the clock input of latch 88 and outputs a low signal on line 94 when a CO signal is detected from adder 68 at the data input of latch 88. The low signal on line 94 deactivates the Count Enable on divider 82, thus halting the count of divider 82 for one period of the high frequency clock. The edge detector circuit thus functions to slow the divider 82 relative to the high frequency clock signal and divide the high frequency clock by one more count, i.e., in the described embodiment, the high frequency clock is divided by 65 instead of 64. The compensation clock is thus 100 MHz/65=1.1538 MHz for that particular cycle of the high frequency clock.

The MSB output of divider 82 is also inverted (for timing reasons) and input to the enable input of latch 70 on line 76. Latch 70 thus allows the sum from adder 68 to feed back to the adder at the clock rate of the compensation clock on line 62. The summing of the coefficient provides a carry out (CO) on line 715 at a predetermined frequency at the D input of the edge detector circuit 84. The CO from adder 68 determines when edge detector circuit 84 deactivates divider 82 and thus controls the fine tuning of the divider 82 to provide an adjusted compensation clock. For example, the desired frequency for a T1 transmission line is 1.1544 MHz. If edge detector circuit 84 has not been activated with a CO pulse, a clock with a slightly higher frequency is output from divider 82. If the edge detect circuit 84 is activated, a clock with a slightly lower frequency is output from divider 82. The frequency of the compensation clock is thus adjusted either higher or lower than the desired clock frequency of 1.544 MHz to compensate for the timing errors on the input signal. The NCO tracks the average input signal frequency on line 46 using the coefficents from the look-up table of ROM 42, the buffer 38 absorbs the jitter and the jitter on output signal line 54 is substantially reduced.

The present invention includes a high frequency portion that only must increment a 6 bit counter in the period of the high frequency clock instead of having to add large-bit numbers in an adder, such as adder 68. This allows a much higher clock frequency to be used and thus a higher resolution in output clock frequency. In order to meet the AT&T 62411 standard jitter specification of 0.02 uI (unit intervals), a high frequency clock must be used. For example, in the T1 standard of 1.544 Mbits/sec, a unit interval is 1/1.544 MHz or about 648 nanoseconds; a 0.02 uI specification of intrinsic jitter thus allows a minimum of a 12.96 nanosecond (about 77 MHz) clock. A 100 MHz clock with a 10 ns period will provide the desired resolution to meet this specification, and the high frequency portion of the present invention allows this to be accomplished.

While this invention has been described in terms of several preferred embodiments, it is contemplated that alterations, modifications and permutations thereof will become apparent to those skilled in the art upon a reading of the specification and study of the drawings. It is intended that the claims include all such alterations, modifications and permutations as fall within the spirit and scope of the present invention.

What is claimed is:

1. A circuit for attenuating jitter comprising:

a jitter sensor operative to produce a digital output signal in accordance with the amount of jitter on an input signal, said input signal being compared to a compensation clock signal derived, at least in part, from a high frequency reference clock signal;

a clock generator coupled to said jitter sensor and responsive to said digital output signal, said clock generator including:
   (a) a low frequency portion including an adder operative to sum said digital output signal with a previous sum of said adder; and
   (b) a high frequency portion coupled to said low frequency portion and to said high frequency reference clock signal and operative to produce said compensation clock signal of a frequency determined in part by said digital output signal and derived from said high frequency reference clock signal, said frequency of said compensation clock signal being lower than a frequency of said high frequency reference clock signal, wherein said high frequency portion includes a frequency divider coupled to said adder and to said high frequency reference clock signal, said frequency divider producing said compensation clock signal;
wherein said clock generator includes an edge detector circuit receptive to an output of said adder and to said high frequency reference clock signal, said edge detector circuit having an output coupled to an enabling input of said frequency divider such that said edge detector circuit is operative to adjust the frequency of said compensation clock signal by selectively disabling said frequency divider; and
output circuitry coupled to said compensation clock signal and said input signal and operative to produce an output signal with reduced jitter.

2. A circuit as recited in claim 1 wherein said input signal includes an input clock signal and an input data signal.

3. A circuit as recited in claim 2 wherein said jitter sensor includes a first counter coupled to said input clock signal, and a second counter coupled to said compensation clock signal, where said first counter and said second counter are out-of-phase.

4. A circuit as recited in claim 3 wherein counts of said first counter and said second counter are used to sense a difference in frequency between said input clock signal and said compensation clock signal.

5. A circuit as recited in claim 4 wherein said jitter sensor includes a look-up table stored in non-volatile memory, wherein said look-up table is addressed by a signal derived from the count of said first counter to provide a signal indicative of the amount of jitter on said input signal.

6. A circuit as recited in claim 4 wherein said output circuitry includes a buffer having a write address input coupled to an output of said first counter, having a read address input coupled to said second counter and having a data input coupled to said input data signal, said buffer having an output signal substantially free of jitter.

7. A method for attenuating jitter comprising:
   (a) producing a digital signal in accordance with the amount of jitter on an input signal compared to a compensation clock signal derived, at least in part, from a high frequency reference clock signal having a frequency higher than a frequency of said input signal;
   (b) producing said compensation clock signal derived from said high frequency reference clock signal with a frequency determined, at least in part, by said digital signal, said compensation clock signal having a frequency lower than said frequency of said high frequency reference clock signal, and wherein said step (b) includes providing a low frequency output derived from said digital signal and inputting said low frequency output to an edge detector circuit operative to output an enabling signal to a frequency divider and thereby adjust the frequency of said compensation clock signal by selectively disabling said frequency divider;
   (c) buffering said input signal; and
   (d) releasing said buffered input signal as a de-jittered output signal, in accordance with said compensation clock signal.

8. A method as recited in claim 7 wherein said step of producing a digital signal comprises addressing a look-up table stored in memory to produce a coefficient representative of the jitter on said input signal.

9. A method as recited in claim 8 wherein said step (b) comprises:
   summing said coefficient with a stored previous sum to produce said low frequency output.

10. A method as recited in claim 9 wherein said high frequency clock signal has a frequency of at least about 100 MHz.

11. A method as recited in claim 8 wherein said step of producing a digital signal includes sensing a phase difference between a clock portion of said input signal and said compensation clock signal, and addressing a location in said look-up table representative of said phase difference.

12. A circuit for attenuating jitter comprising:
   a jitter sensor operative to producing a digital signal in accordance with the amount of jitter on an input signal compared to a compensation clock signal derived, at least in part, from a high frequency reference clock signal having a frequency higher than a frequency of said input signal;
   a clock generator for producing said compensation clock signal derived from said high frequency reference clock signal with a frequency determined, at least in part, by said digital signal, said compensation clock signal having a frequency lower than said frequency of said high frequency reference clock signal, and wherein said clock generator provides a low frequency output derived from said digital signal, said low frequency output being input to an edge detector circuit operative to output an enabling signal to a frequency divider to thereby adjust the frequency of said compensation clock signal by selectively disabling said frequency divider; and
   a buffer for buffering said input signal and releasing said buffered input signal as a de-jittered output signal, in accordance with said compensation clock signal.

13. A circuit as recited in claim 12 wherein said clock generator includes an adder to provide said low frequency output to said edge detector circuit, said adder summing said digital signal with a previous sum of said adder to produce said low frequency output.

14. A circuit as recited in claim 13 wherein said input signal includes an input clock signal and an input data signal.

15. A circuit as recited in claim 13 wherein said jitter sensor includes a first counter coupled to said input clock signal, and a second counter coupled to said compensation clock signal, where said first counter and said second counter are out-of-phase, wherein counts of said first counter and said second counter are used to sense a difference in frequency between said input clock signal and said compensation clock signal.

16. A circuit as recited in claim 13 wherein said high frequency clock signal has a frequency of at least about 100 MHz.

* * * * *